United States Patent [19]
Nishiyama

[11] Patent Number: 6,163,181
[45] Date of Patent: Dec. 19, 2000

[54] FREQUENCY DIVIDER CIRCUIT AND DIGITAL PLL CIRCUIT

[75] Inventor: Seiichi Nishiyama, Kanagawa, Japan

[73] Assignee: Sony Corporation, Tokyo, Japan

[21] Appl. No.: 09/154,088

[22] Filed: Sep. 16, 1998

[30] Foreign Application Priority Data

Sep. 17, 1997 [JP] Japan .................................. 9-252333

[51] Int. Cl.[7] .................................................. H03K 21/00
[52] U.S. Cl. .......................... 327/115; 327/150; 327/151; 327/159; 377/44; 377/47
[58] Field of Search ...................... 377/47, 44; 327/115, 327/117, 147, 150, 151, 156, 159, 160

[56] References Cited

U.S. PATENT DOCUMENTS

| | | | |
|---|---|---|---|
| 4,383,303 | 5/1983 | Hoffman | 377/47 |
| 4,393,301 | 7/1983 | Svendsen | 377/47 |
| 5,089,717 | 2/1992 | Gamand et al. | 377/47 |
| 5,091,699 | 2/1992 | Erickson et al. | 377/47 |

*Primary Examiner*—Margaret R. Wambach
*Attorney, Agent, or Firm*—Ronald P. Kananen; Rader, Fishman & Grauer

[57] ABSTRACT

A frequency divider circuit, and a digital PLL circuit including the same, which can suppress jitter occurring in an output signal, including a first circuit module which drives D-FFs connected in series using an input signal as a reference clock signal and divides the input signal by a frequency division ratio selected by a frequency division ratio determining signal to produce a first divided signal; a second circuit module which drives D-FFs connected in series using the first divided signal as a reference clock signal and divides the first divided signal by a frequency division ratio corresponding to the number of D-FFs connected in series to produce an output signal; and an OR circuit which produces a frequency division ratio determining signal based on the outputs of the D-FFs of the second circuit module and a frequency division ratio selecting signal.

16 Claims, 13 Drawing Sheets

FREQUENCY DIVIDER CIRCUIT AND DIGITAL PLL CIRCUIT

BACKGROUND OF THE INVENTION

1. Field of the Invention

The present invention relates to a frequency divider circuit and a digital phase locked loop (PLL) circuit including the same.

2. Description of the Related Art

FIG. 1 is a block diagram of a general programmable digital PLL circuit.

As shown in FIG. 1, a digital PLL circuit 6 comprises, for example, a phase comparator 2, a digital counter 8, a frequency multiplier 4, and a frequency divider 5.

The phase comparator 2 compares a phase of a reference clock signal of a frequency $f_{ref}$ with that of an oscillation output f5 from the frequency divider 5 and outputs an up/down signal to a digital counter 8 in accordance with the result of the comparison. For example, when the frequency of the oscillation output f5 is lower than the reference clock signal, it outputs an up signal to the digital counter 8, while in the opposite case, it outputs a down signal to the digital counter 8.

The digital counter 8 counts up or counts down the count value from the least significant bit toward the most significant bit based on the up/down signal from the phase comparator 2 and outputs an n-bit count value to the frequency multiplier 4.

The frequency multiplier 4 has the same function as a voltage controlled oscillator (VCO), determines an oscillation frequency in accordance with an input count value S3, and finally outputs the target clock S4 of the frequency $f_0$.

The frequency divider 5 outputs an oscillation output f5 obtained by dividing the output signal S4 from the frequency multiplier 4 to the phase comparator 2.

The digital PLL circuit 6 shown in FIG. 1 requires an operation time of as much as $2^n/f_{ref}$ to reach a locked status shown in FIG. 2 when the digital counter 8 is an n-bit counter.

In the digital PLL counter 6, the digital counter 8 is provided with a 32/33 frequency divider which selectively performs frequency division by 32 or 33 and uses this 32/33 frequency divider to count up or count down.

FIG. 3 is a circuit diagram of a frequency divider 1 of the related art which is provided in the digital counter 8 in FIG. 1.

FIGS. 7A to 7N and FIGS. 8A to 8N are timing charts of input signals S0, S7, S9, S11, and S14, and frequency division ratio determining signals S21, S14, S17, and S19.

FIGS. 7A to 7N are timing charts in the case where a 4/5 selecting signal S24 shown in FIG. 3 is a high level (when 4 is selected as a frequency division ratio in the circuit module 3). FIGS. 8A to 8N are timing charts in the case where the 4/5 selecting signal S24 shown in FIG. 3 is a low level (when 5 is selected as a frequency division ratio in the circuit module 3).

The frequency divider 1 divides the frequency of an input signal S0 by 32 or 33 in accordance with the 4/5 selecting signal S24.

As shown in FIG. 3, the frequency divider 1 comprises the circuit modules 3 and 5.

The circuit module 3 comprises D-type flip-flops (D-FFs) 7, 9, and 11, an AND circuit 13, and an OR circuit 14.

The D-FFs 7, 9, and 11 are driven using the input signal S0 as a reference clock.

The circuit module 3 divides the input signal S0 by 4 or 5 based on the frequency division ratio determining signal S21, shown in FIG. 7J and FIG. 8J, input from the circuit module 5 and outputs the divided signal S7 from a $\overline{Q}$ terminal of the D-FF 7 to the circuit module 5. Specifically, the circuit module 3 produces the signal S7 shown in FIG. 8B obtained by dividing the input signal S0 by 5 when the frequency division ratio determining signal S21 is a high level, and produces the signal S7 shown in FIG. 7B obtained by dividing the input signal S0 by 4 when the frequency division ratio determining signal S21 is a low level.

The circuit module 5 comprises D-FFs 15, 17, and 19, a 4-input NOR circuit 21, and a buffer 23.

In the circuit module 5, a CLK terminal of the D-FF 15 is connected to a $\overline{Q}$ terminal of the D-FF 7 in the circuit module 3, a Q terminal of the D-FF 15 is connected to a CLK terminal of the D-FF 17, and a Q terminal of the D-FF 17 is connected to a CLK terminal of the D-FF 19. Also, in the D-FFs 15, 17, and 19, the D terminals and $\overline{Q}$ terminals are connected.

Here, the D-FFs 15, 17, and 19 are connected in series and each D-FF can divide a signal into two. Accordingly, a signal S19 shown in FIGS. 7N and 8N obtained by dividing the signal S7 by 8 ($=2^3$) is output at the Q terminal of the D-FF 19.

The signal S19 is output as an output signal S1 via the buffer 23.

A signal S15 shown in FIGS. 7L and 8L obtained by dividing the signal S7 by 2 ($=2^1$) is output from the Q terminal of the D-FF 15, and a signal S17 shown in FIGS. 7M and 8M obtained by dividing the signal S7 by 4($=2^2$) is output from the Q terminal of the D-FF 17.

The NOR circuit 21 receives as input four signals, that is, the signals S15, S17, and S19 from the Q terminals of the D-FFs 15, 17, and 19 and the 4/5 selecting signal S24, and outputs the result of the NOR operation to the AND circuit 13 in the circuit module 13 as a frequency division ratio determining signal S21. Here, the frequency division ratio determining signal S21 becomes a high level, as shown in FIGS. 7J and 8J, when all of the signals S15, S17, and S19 and the 4/5 selecting signal S24 are a low level, while becomes a low level in other cases.

In the case of dividing a signal by 32 in the frequency divider 1, the 4/5 selecting signal S24 is held at a high level and the signal S7 obtained by dividing the input signal S0 by 4 is divided by 8 in the circuit module 5. As a result, an output signal S1 obtained by dividing the input signal S0 by 32 is produced.

On the other hand, when the frequency divider 1 divides a signal by 33, it makes the circuit module 3 act as a 1/4 frequency divider for seven cycles out of 8 cycles of the signal S7 and act as a 1/5 frequency divider for one cycle out of eight cycles. Due to this, the operation becomes (4×7/8+ 5×1/8)×8, so the frequency divider 1 produces the output signal S1 obtained by dividing the input signal S0 by 33.

The problem in the related art was, however, that the PLL circuits used in the cellular phone and other communications fields mainly use frequency dividers containing bipolar, not MOS logic, since the local frequencies have high frequency bandwidths of 1 GHz or more.

Also, the power source voltage of PLL circuits used in such communications fields is 3V in most cases, and a basic type of a D-FF has the configuration shown in FIG. 4.

Namely, the D-FF comprises differential amplifier circuits 200 and 201, emitter-coupled logic (ECL) circuits 202 and 203, and latch circuits 204 and 205.

The differential amplifier circuit 200 comprises emitter-coupled npn-type transistors Q1 and Q2 and a constant current source I0 provided at the coupling point. The differential amplifier circuit 201 comprises emitter-coupled npn-type transistors Q3 and Q4 and a constant current source I1 provided at the coupling point.

The ECL circuit 202 comprises emitter-coupled npn-type transistors Q5 and Q6. The ECL circuit 203 comprises emitter-coupled npn-type transistors Q9 and Q10.

The latch circuit 204 comprises collector-, base-, and emitter-coupled npn-type transistors Q7 and Q8. The latch circuit 205 comprises collector-, base-, and emitter-coupled npn-type transistors Q11 and Q12.

In this circuit configuration, the output amplitude of the D-FF can only be about 0.3V or less. It is necessary to reduce the load resistance to improve the through rate.

However, recent cellular phones are expected to provide longer call times, therefore if the load resistance is made small as mentioned above, this will result in an increase of the current consumption and the power consumption.

Also, when the through rate is poor, the jitter increases in the output of a bipolar ECL circuit and noise increases in the VCO output signal of the PLL circuit. As a result, the bit error rate of the digital communications signal becomes Inferior.

For example, in the D-FF in FIG. 4, when the waveforms of an E input signal and an F input signal produced by an input signal from the D terminal are as shown in FIG. 5A, jitter Ax shown in FIG. 5B is generated in the output signals G and H.

Note that in the frequency divider 1 shown in FIG. 3, the D-FFs 15, 17, and 19 are serially connected in an asynchronous mode in the circuit module 5.

Accordingly, the jitter occurring at the D-FF 15 is transmitted to the D-FFs 17 and 19, and jitter ΔY, which is three times the jitter AX, occurs in the output signals G and H output from the final stage D-FF 19 as shown in FIG. 5C.

Consequently, in the frequency divider 1 shown in FIG. 3, the jitter becomes large in the finally obtained output signal S1. If the frequency divider 1 is used in a PLL circuit, the phase noise of the VCO output signal of the PLL circuit will increase and the bit error rate of the digital communications signal will end up becoming inferior.

SUMMARY OF THE INVENTION

An object of the present invention is to provide a frequency divider circuit, and a digital PLL circuit including the same, which can suppress the jitter occurring in an output signal.

According to a first aspect of the present invention, there is provided a frequency divider circuit comprising a first frequency divider including a plurality of storage circuits connected in series and formed as a frequency divider, driving in response to an input signal as a reference clock signal and dividing said input signal by a frequency division ratio selected by a frequency division ratio determining signal to produce a first divided signal; a second frequency divider including a plurality of storage circuits connected in series and formed as a frequency divider, driving in response to said first divided signal as a reference clock signal and dividing said first divided signal by a frequency division ratio corresponding to the number of said storage circuits connected in series to produce a second divided signal; and a frequency division ratio determining means for producing the frequency division ratio determining signal on the basis of outputs of the storage circuits of the second frequency divider.

According to a second aspect of the present invention, there is provided a digital PLL circuit comprising a frequency divider for producing an oscillation output obtained by dividing an output signal from a frequency multiplying means; a phase comparing means for comparing phases of a reference signal and the oscillation output of the frequency divider; a digital counter for performing a count using a frequency divider circuit of the first aspect of the invention based on the result of comparison of the phase comparing means; and a frequency multiplying means for determining an oscillation frequency to produce an output signal based on the result of the count of the digital counter and finally producing an output signal of a target frequency.

Preferably, in the first and second aspects of the invention, the first frequency divider connects the plurality of storage circuits driven based on an input signal so as to input an inverted output of a first stage storage circuit to a second stage storage circuit and, when there are later stage storage circuits, successively output the output of the second stage storage circuit to the later stage storage circuits and so as to, based on the frequency division ratio determining signal, feed back a signal corresponding to a logical and of an output of a final stage storage circuit and an output of a storage circuit other than the final stage to an input of the first stage storage circuit and uses the inverted output of the first stage storage circuit as the first divided signal and the second frequency divider connects the plurality of storage circuits driven based on the first divided signal so as to input an inverted output of a first stage storage circuit to a second stage storage circuit, input an output of a preceding stage storage circuit to a succeeding stage storage circuit for the third stage on, and input the output of the final stage storage circuit to the first stage storage circuit and uses the output of the final stage storage circuit as the second divided signal.

More preferably, the first frequency divider connects the plurality of storage circuits driven based on an input signal so as to, based on the frequency division ratio determining signal, feed back a signal corresponding to a logical and of the output of the final stage storage circuit and an output of a one storage circuit before the final stage to the input of the first stage storage circuit.

Alternatively, preferably, the first frequency divider connects the plurality of storage circuits driven based on an input signal so as to input an inverted output of a first stage storage circuit to a second stage storage circuit and, when there are later stage storage circuits, successively output the output of the second stage storage circuit to the later stage storage circuits and so as to, based on the frequency division ratio determining signal, feed back an output of a final stage storage circuit to an input of the first stage storage circuit and uses the inverted output of the first stage storage circuit as the first divided signal and the second frequency divider connects the plurality of storage circuits driven based on the first divided signal so as to input an inverted output of a first stage storage circuit to a second stage storage circuit, input an output of a preceding stage storage circuit to a succeeding stage storage circuit for the third stage on, and input the output of the final stage storage circuit to the first stage storage circuit and uses the output of the final stage storage circuit as the second divided signal.

More preferably, the first frequency divider connects the plurality of storage circuits driven based on an input signal so as to, based on the frequency division ratio determining signal, feed back the output of the final stage storage circuit to the input of the first stage storage circuit.

More preferably, the second frequency divider further has at a post-final stage after the final stage storage circuit a storage circuit is driven using the input signal as a reference clock signal and receives as input the second divided signal.

More preferably, the frequency division ratio determining means produces a frequency division determining signal which indicates to perform frequency division by a first frequency division ratio when all of the outputs of all of the storage circuits of the second frequency divider circuit and the frequency division ratio selecting signal have become a first logical level.

Preferably, the frequency divider circuit further has a swallow counter which produces the frequency division ratio selecting signal and performs a count based on the second divided signal produced by the second frequency divider circuit.

Preferably, the storage circuits are D-type flip-flops.

BRIEF DESCRIPTION OF THE DRAWINGS

These and other objects and features of the present invention will become clearer from the following description of the preferred embodiments given with reference to the accompanying drawings, in which.

DESCRIPTION OF THE PREFERRED EMBODIMENTS

Below, preferred embodiments will be described with reference to the accompanying drawings.

First Embodiment

Figure 6:
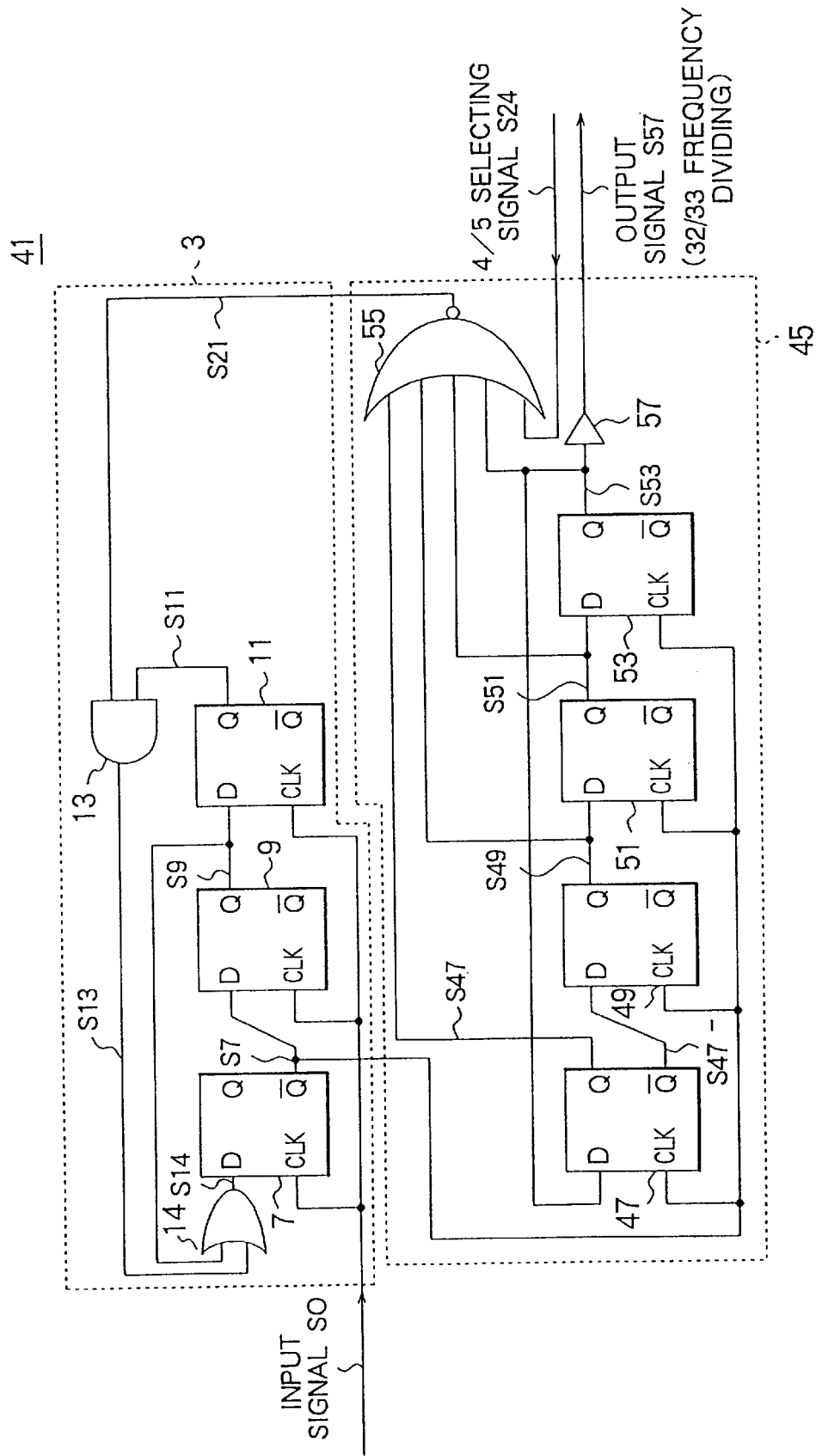
FIG. 6 is a circuit diagram of a frequency divider circuit of a digital PLL circuit according to a first embodiment of the present invention.

FIG. 6 is a circuit diagram of a frequency divider circuit 41 of a digital PLL circuit according to the first embodiment.

Figure 1:
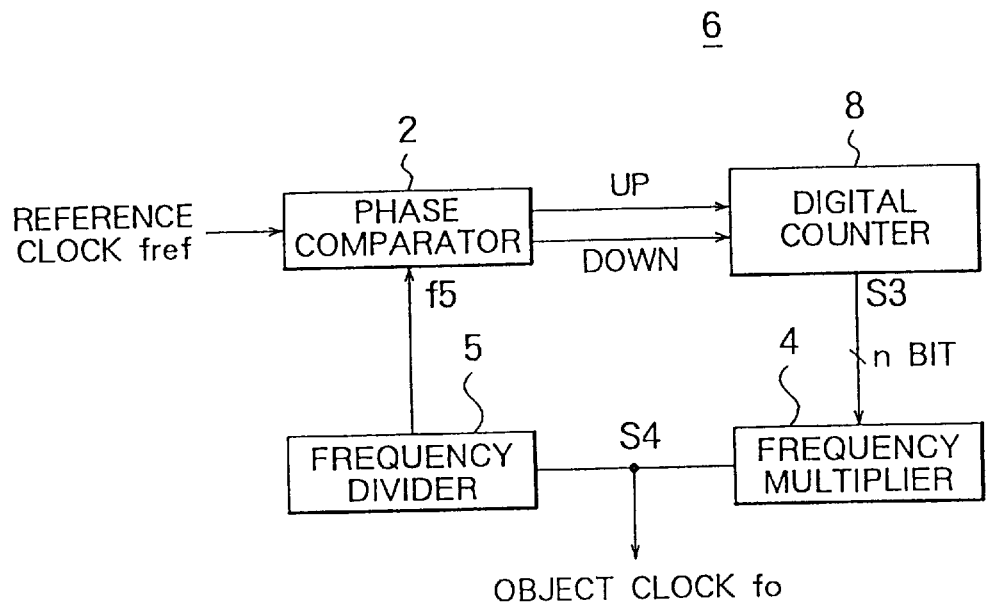
FIG. 1 is a block diagram of a general programmable digital PLL circuit.
Figure 2:
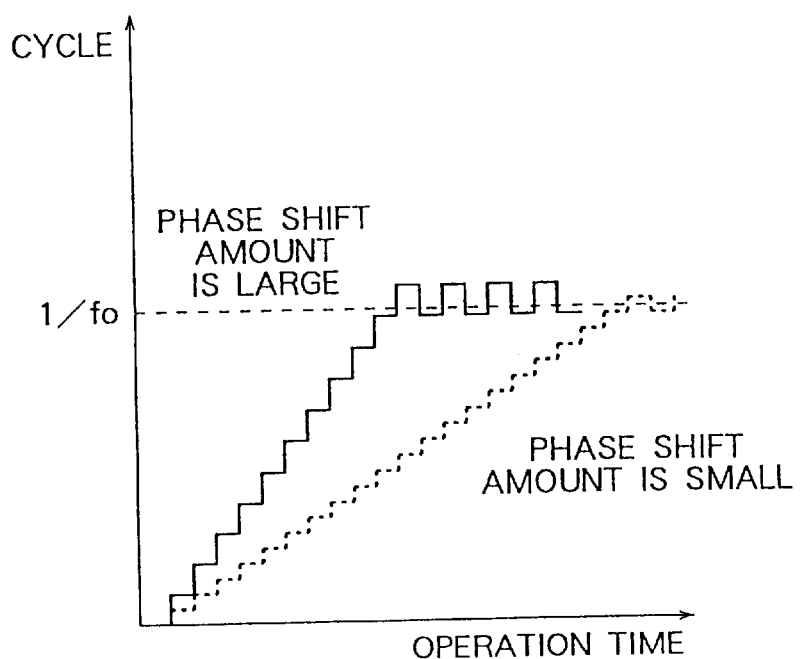
FIG. 2 is a view for explaining the operation of the digital PLL circuit shown in FIG. 1.

The frequency divider circuit 41 is provided in the digital counter 8 of the digital PLL circuit shown in FIG. 1.

FIGS. 7F, 7G, 7H, and 7I and FIGS. 8F, 8G, 8H, and 8I are timing charts of the signals S49, S51, S53, and S47 shown In FIG. 6, respectively.

Figure 7:
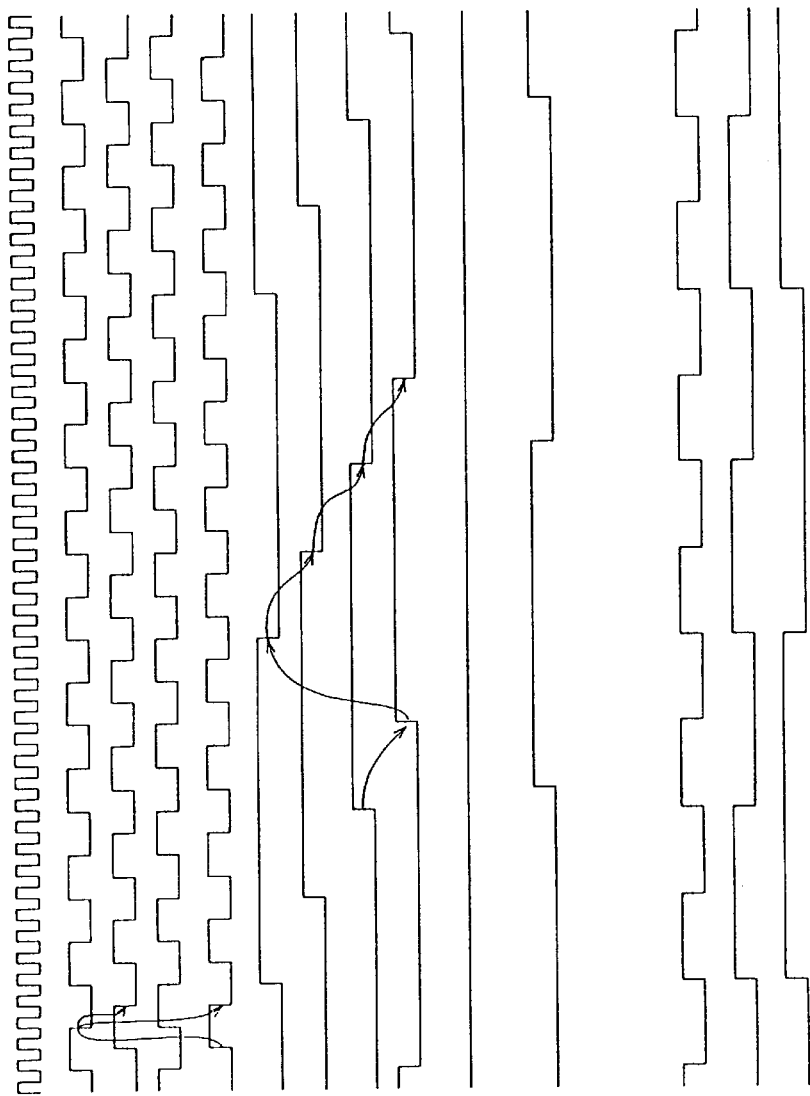
FIGS. 7A to 7N are timing charts of respective signals of the frequency divider circuit shown in FIG. 6 in the case where a preceding stage circuit module selects 4 as a frequency division ratio.
Figure 8:
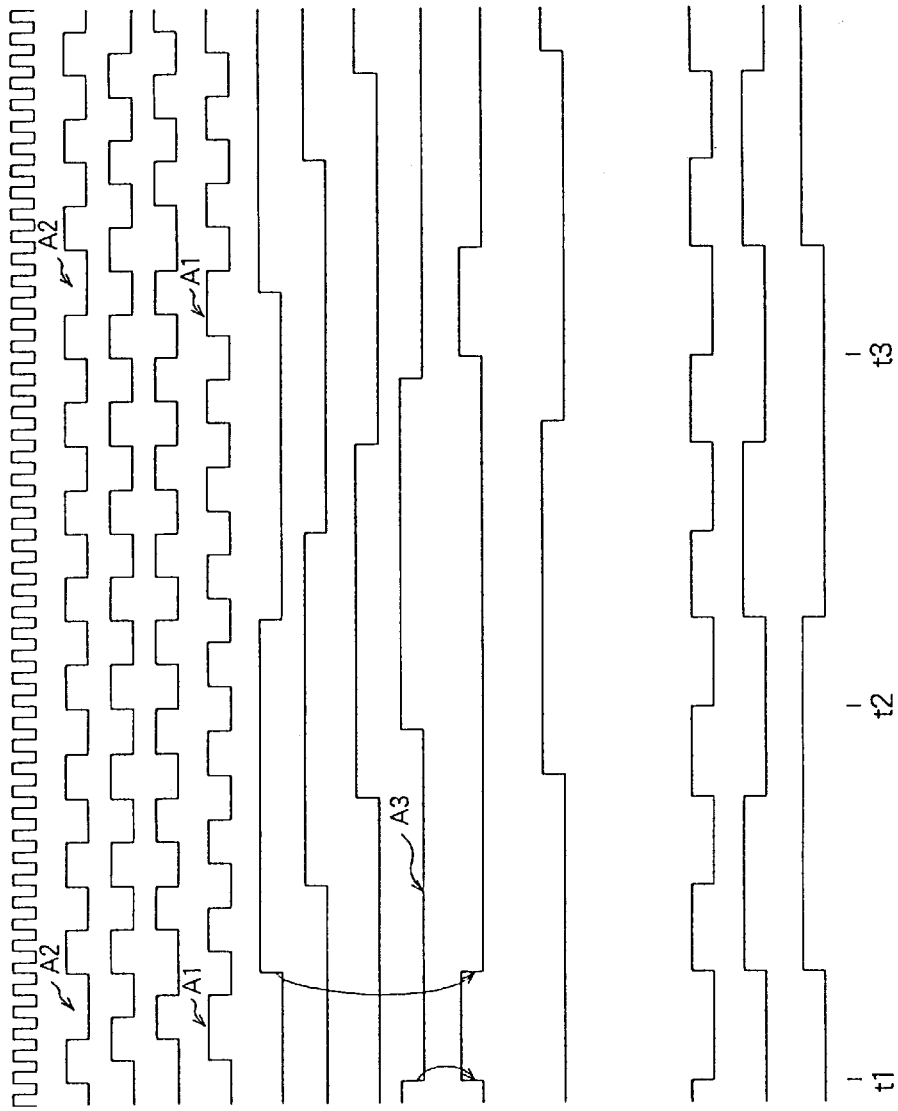
FIGS. 8A to 8N are timing charts of respective signals of the frequency divider shown in FIG. 6 in the case where a preceding stage circuit module selects 5 as a frequency division ratio.

Here, FIGS. 7A to 7N are timing charts of the case where the 4/5 selecting signal S24 is a high level (when 4 is selected as a frequency division ratio in the circuit module 3). FIGS. 8A to 8N are timing charts of the case where the 4/5 selecting signal S24 shown in FIG. 6 is a low level (when 5 is selected as a frequency division ratio in the circuit module 3).

As shown in FIG. 6, the frequency divider circuit 41 comprises a circuit module 3 as a first frequency divider and a circuit module 45 as a second frequency divider.

Figure 3:
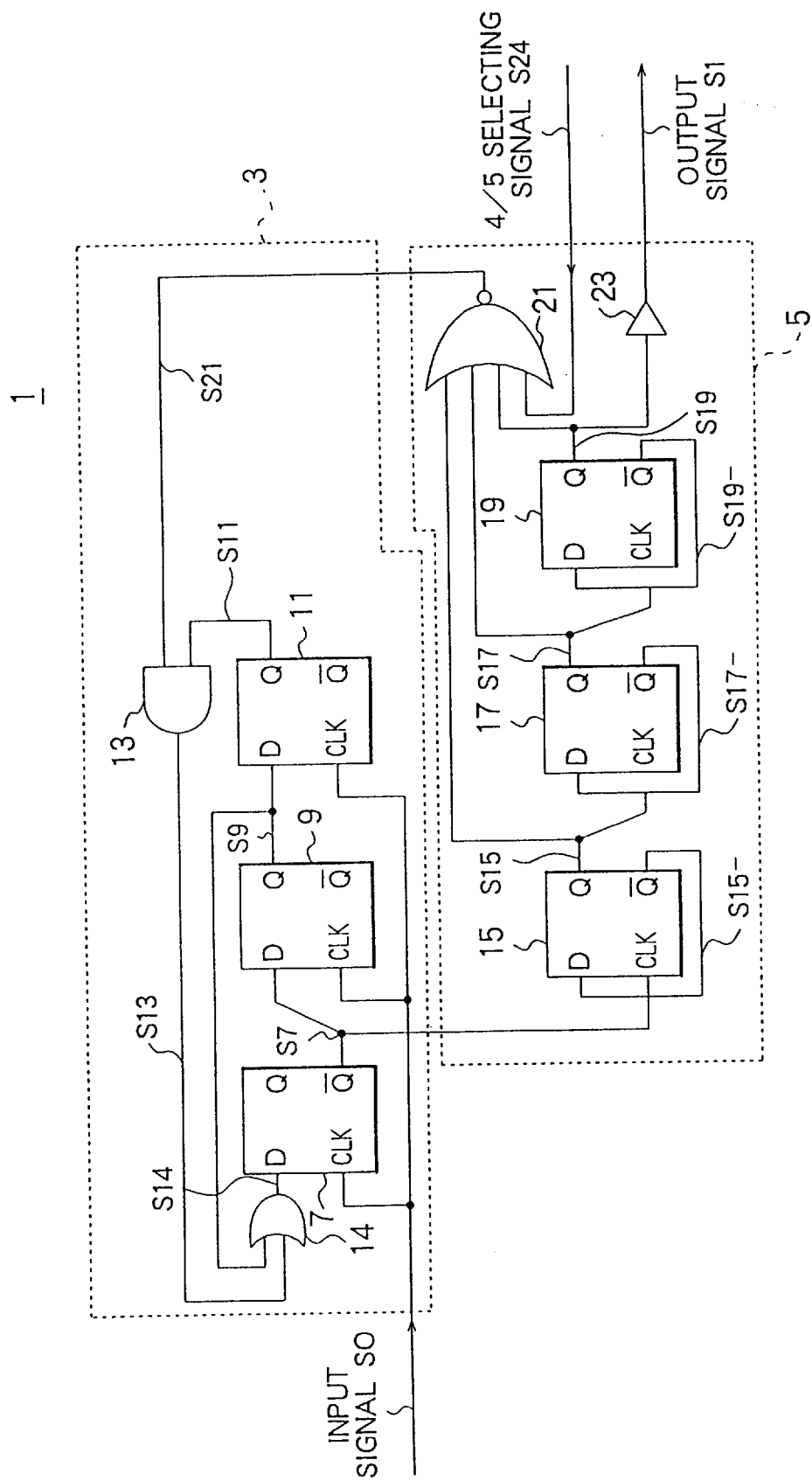
FIG. 3 is a circuit diagram of a frequency divider of the related art provided in the digital counter shown in FIG. 1.
Figure 4:
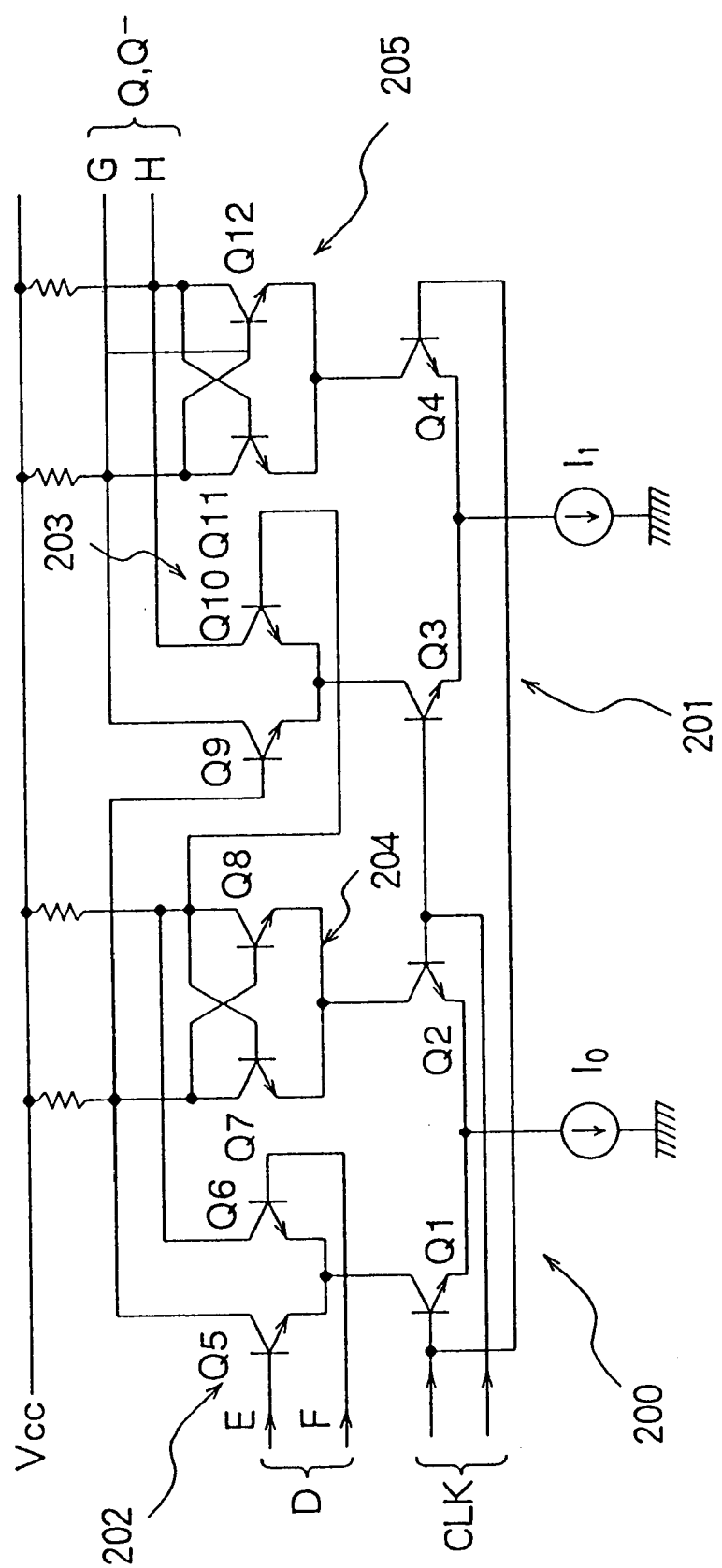
FIG. 4 is a view of an internal configuration of a general D-FF.
Figure 5A:
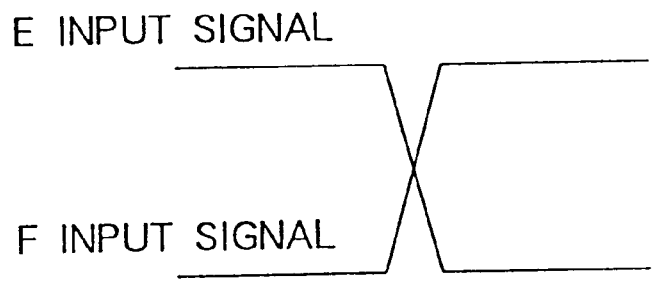
FIGS. 5A to 5C are views for explaining jitter occurring at a D-FF.
Figure 5B:
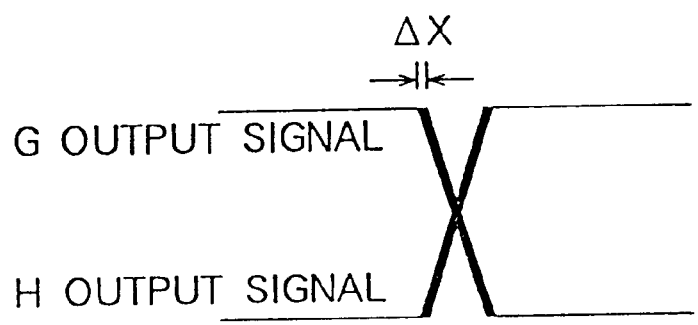
Figure 5C:
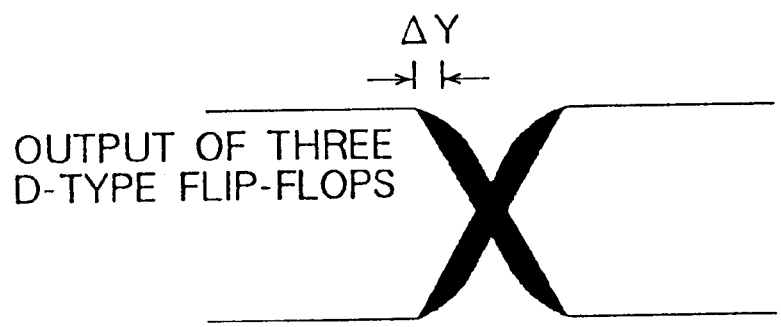

Here, the circuit module 3 is the same as the circuit module 3 of the frequency divider of the related art shown in FIG. 3 mentioned above.

Accordingly, the timing charts of the input signals S0, S7, S9, S11, and S14 and the frequency division ratio determining signals S21, S15, S17, and S19 shown in FIG. 6 become the same as shown in FIGS. 7A, 7B, 7C, 7D, 7E, 7J, 7L, 7M, and 7N and FIGS. 8A, 8B, 8C, 8D, 8E, 8J, 8L, 8M, and 8N, in the same way as the frequency divider 1 mentioned above.

Below, a detailed explanation will be given of the circuit module 45 shown in FIG. 6.

The circuit module 45 comprises D-FFs 47, 49, 51, and 53, a 5-input NOR circuit 55 as a frequency division ratio determining means, and a buffer 57.

A Q̄ terminal of the D-FF 47 Is connected to the D terminal of the D-FF 49, a Q terminal of the D-FF 49 is connected to the D terminal of the D-FF 51, a Q terminal of the D-FF 51 is connected to a D terminal of the D-FF 53, and a Q terminal of the D-FF 53 is connected to a D terminal of the D-FF 47.

Namely, in this configuration, an output of the D-FF 47 is transferred to the D-FF 49, 51, and 53, in order and an output of the D-FF 53 is fed back to the input of the D-FF 47.

Also, the CLK terminals of D-FFs 47, 49, 51, and 53 are connected to a Q terminal of the D-FF 7 of the circuit module 3 and are driven synchronously with the signal S7.

Here, as shown in FIGS. 7F to 7I, for example, the effect of the level change of the Q terminal of the D-FF 53 is fed back to the Q terminal of the D-FF 53 as an inverted level change after a time period of four cycles of the signal S7 (the number of stages of the D-FFs 47, 49, 51, and 53). Accordingly, the signals S47, S47⁻, S49, S51, and S53 become signals obtained by dividing the signal S7 by 8.

The NOR circuit 55 receives as input the signals S47, S49, S51, and S53 from the Q terminals of the D-FFs 47, 49, 51, and 53 and the 4/5 selecting signal and outputs the result of the NOR operation on these to the circuit module 3 as a frequency division ratio determining signal S21.

Here, the waveform of the frequency division ratio determining signal S21 is shown by FIG. 7J and FIG. 8J and is the same as that of the frequency division ratio determining signal S21 output from the NOR circuit 21 of the frequency divider 1.

Figure 9:
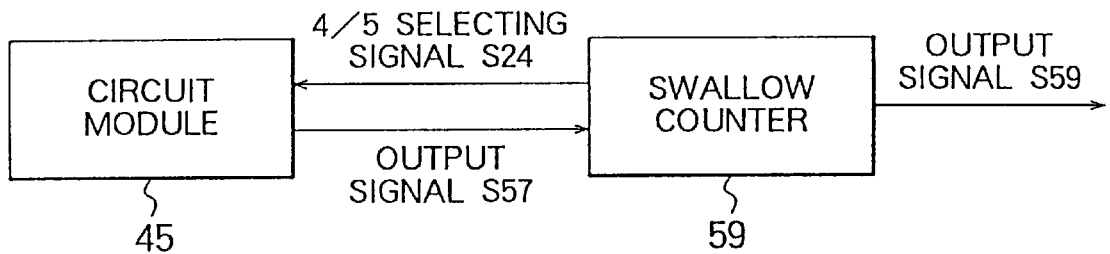
FIG. 9 is a view for explaining a swallow counter.

The 4/5 selecting signal S24 is, as shown in FIG. 9, output from the swallow counter 59.

Figure 10A:
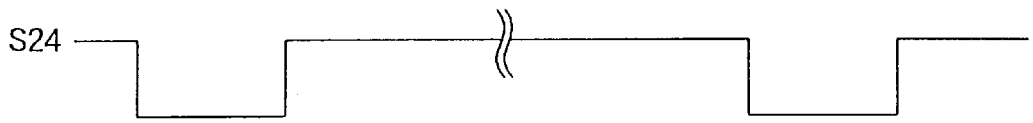
FIG. 10A is a view of a waveform of a 4/5 selecting signal shown in FIG. 6.

The swallow counter 59 outputs the 4/5 selecting signal S24 shown in FIG. 10A to the circuit module 45. The circuit module 45 outputs a signal S57 obtained by dividing the input signal S0 by 33 while the 4/5 selecting signal S24 is a low level and by dividing the input signal S0 by 32 while the 4/5 selecting signal S24 is a high level.

Figure 10B:
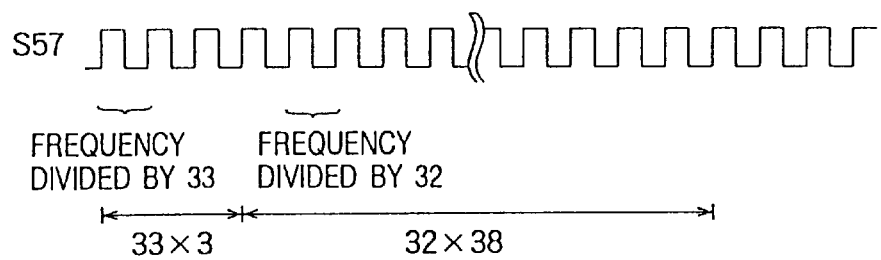
FIG. 10B is a view of a waveform of an output signal shown in FIG. 6.

As shown in FIG. 10B, the output signal S57 includes three cycles worth of a signal obtained by dividing the input signal S0 by 33 and 38 cycles worth of a signal obtained by dividing the input signal S0 by 32.

The swallow counter 59 counts the count value 1315 (33×3+32×38) by counting a pulse included in the output signal S57.

Next, the operation of the frequency divider circuit 41 shown in FIG. 6 will be explained.

First, the operation of a frequency divider circuit 41 when dividing a signal by 32 will be explained referring to FIGS. 7A to 7N.

In this case, as shown in FIGS. 7A to 7N, the 4/5 selecting signal S24 is held at a high level and, as shown in FIG. 7J, the frequency division ratio determining signal S21 is held at a low level. Accordingly, the signal S13 is held at a low level as well, and the signal S9 shown in FIG. 7C output from the Q terminal of the D-FF 9 is output to the D terminal of the D-FF 7 as a signal S14 shown in FIG. 7E.

Due to this, for example, the effect of the level change of the D terminal of the D-FF 7 is fed back to the D terminal of the D-FF 7 as an inverted level change after the elapse of a time of one cycle of the input signal S0×2 (number of stages of D-FFs 7 and 9). Accordingly, as shown in FIGS. 7B, 7C, and 7E, the signals S7, S9, and S14 become the input signal S0 divided by 4.

Next, the signal S7 is input to the CLK terminal of the D-FF 47. Here, as mentioned above, as shown in FIGS. 7I, 7F, 7G, and 7H, the signals S47, S47¯, S49, S51, and S53 become the signal S7 divided by 8, that is, the input signal S0 divided by 32 (=4×8).

The signal S53 is output as an output signal S57 via the buffer 57.

Here, the output signal S57 becomes the input signal S0 divided by 32.

Next, the operation of the frequency divider circuit 41 when dividing a signal by 33 will be explained referring to FIGS. 8A to 8N.

In this case, as shown in FIGS. 8A to 8N, the 4/5 selecting signal S24 is held at a low level, and, as shown in FIG. 8J, the frequency division ratio determining signal S21 becomes a low level or a high level in response to the signals S47, S49, S51, and S53. Accordingly, the AND circuit 13 outputs the signal S11 to the OR circuit 14 as a signal S13 while the frequency division ratio determining signal S21 is a high level.

The OR circuit 14 performs an OR operation on the signal S13 and the signal S9 and outputs the result to the D terminal of the D-FF 7 as a signal S14.

Here, the signal S11 is the signal S9 delayed by one clock cycle in the D-FF 11, therefore a pulse A1 which becomes a high level for exactly three clock cycles appears in the signal S14 corresponding to the period when the frequency division ratio determining signal S21 is a high level.

Also, in response to that, a pulse A2 which becomes a low level for exactly three clock cycles appears in the signal S7.

The signal S7 is input to the CLK terminals of the D-FFs 47, 49, 51, and 53. The signal S7 is used as a clock signal for driving the D-FFs 47, 49, 51, and 53.

Here, for example, in the D-FF 47, the level of the signal S47 is inverted after four cycles of the signal S7. Therefore, as shown in FIG. 8I, the signal S47 is switched from the high level to a low level at the time t1, then is switched from a low level to a high level at the time t2 four cycles of the signal S7 later. At this time, the signal S7 includes the pulse A1 which is a low level for exactly three clock cycles, thus the pulse A3, which becomes a low level for exactly 17 clock cycles, appears in the signal S47.

Next, the signal S47 is held at a high level for exactly 17 clock cycles, then is switched from a high level to a low level at the time t3.

Namely, a cycle of the signal S47 is 33 clock cycles. The signal S47 therefore becomes the signal S0 divided by 33.

The signals S49, S51, and S53 become the input signal S0 divided by 33 in the same way.

The signal S53 is output as an output signal S57 via the buffer 57.

Here, the output signal S57 also becomes the input signal S0 divided by 33.

The NOR circuit 55 performs a NOR operation on the signals S47, S49, S51, and S53 and the 4/5 selecting signal S24 to produce the frequency division ratio determining signal S21 as the result of the operation. At this time, since the 4/5 selecting signal S24 is a low level, the frequency division ratio determining signal S21 becomes a high level when all of the signals S47, S49, S51, and S53 are a low level. Namely, the frequency division ratio determining signal S21 becomes a high level for exactly 5 clock cycles from the time t1, t3, etc.

As explained above, according to the frequency divider circuit 41, it is possible to selectively perform frequency division by 32 and 33.

In the frequency divider circuit 41, the circuit module 45 drives the D-FFs 47, 49, 51, and 53 using the signal S7 as a reference clock. Consequently, the jitter occurring in a preceding stage D-FF is not transferred to the succeeding stage D-FF and consequently the jitter of the output signal S57 can be largely reduced.

As a result, according to the digital PLL circuit of the present embodiment which is provided with the frequency divider circuit 41 as a digital counter, the effect of phase noise can be suppressed, and, for example, a bit error rate of the digital communication signal can be improved.

Second Embodiment

Figure 11:
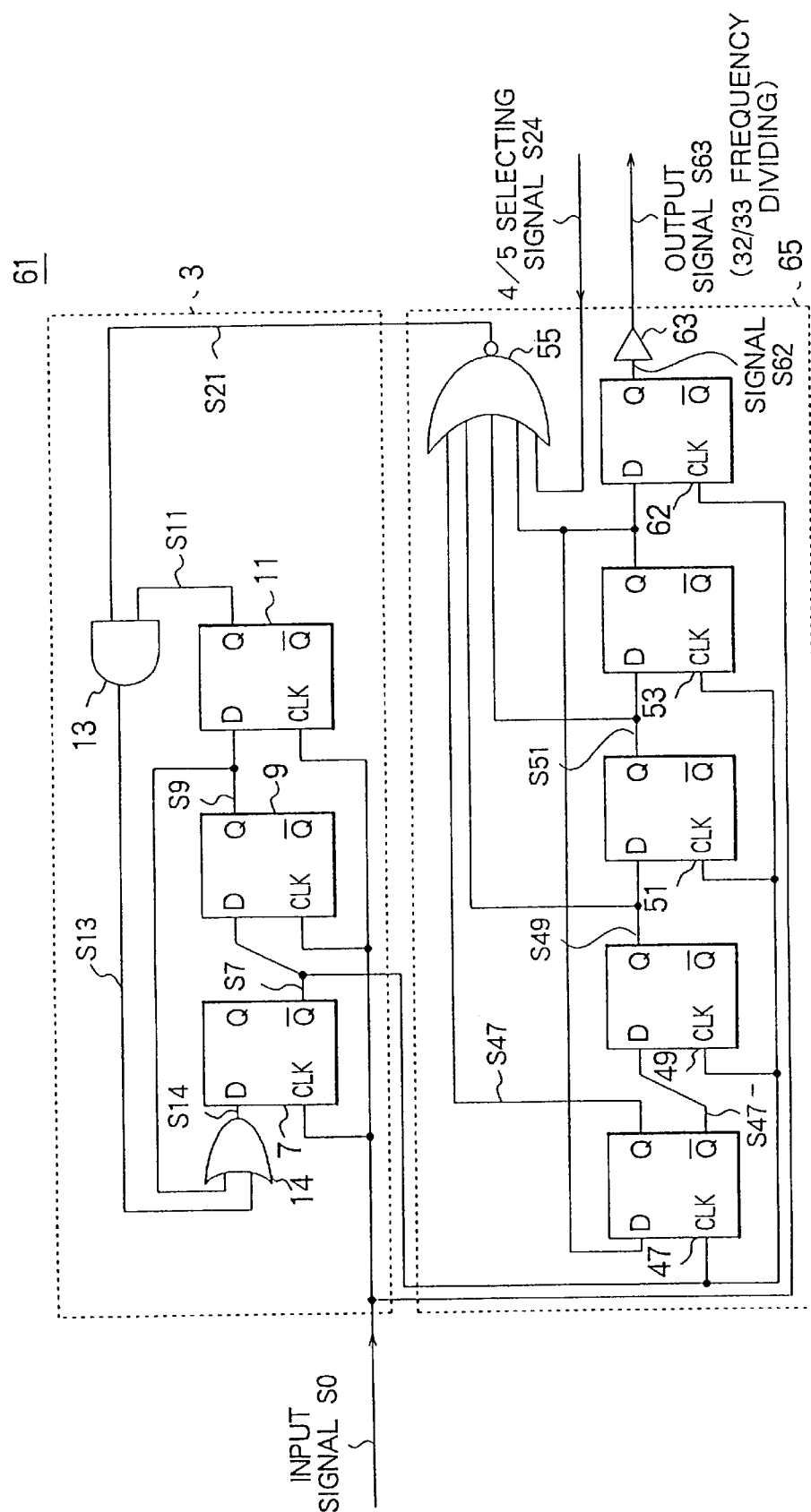
FIG. 11 is a circuit diagram of a frequency divider circuit of a digital PLL circuit according to a second embodiment of the present invention.

FIG. 11 is a circuit diagram of a frequency divider circuit 61 of a digital PLL circuit according to a second embodiment of the present invention.

As shown in FIG. 11, the frequency divider circuit 61 comprises a circuit module 3 serving as a first frequency divider and a circuit module 65 serving as a second frequency divider.

Here, the circuit module 3 is the same as the above mentioned circuit module 3 of the frequency divider 1 of the related art shown in FIG. 3.

Accordingly, the timing charts of input signals S0, S7, S9, S11, and S14 and frequency division ratio determining signals S21, S15, S17, and S19 become the same as those of the frequency divider 1 shown in FIGS. 7A, 7B, 7C, 7D, 7E, 7J, 7L, 7M, and 7N and FIGS. 8A, 8B, 8C, 8D, 8E, 8J, 8L, 8M, and 8N.

Below, the circuit module 65 shown in FIG. 6 will be explained in more detail.

As shown in FIG. 11, the circuit module 65 is configured with a D-FF 62 provided as a succeeding stage of a D-FF 53 of the circuit module 45 shown in FIG. 6.

Namely, a Q terminal of the D-FF 53 is connected to a D terminal of the D-FF 62, and a Q terminal of the D-FF 62 is connected to a buffer 63.

Also, an input signal S0 is input to a CLK terminal of the D-FF 62.

In the circuit module 65, the timing charts of the signals S47, S49, S5, and S53 shown in FIG. 11 become FIGS. 7I, 7F, 7G, and 7H and FIGS. 8I, 8F, 8G, and 8H in the same way as the frequency divider circuit 41 shown in FIG. 6.

The waveform of the signal S53 is shaped in the D-FF 62 using the input signal S0 as a reference and becomes a signal S62 delayed by exactly one clock cycle of the input signal S0 as shown in FIGS. 7K and 8K. The signal S62 is output as an output signal S63 via the buffer 63.

As explained above, according to the frequency divider circuit 61, it is possible to shape the waveform of the signal S53 using the input signal S0 to obtain an output signal S63 which is synchronized with the input signal S0.

Note that in the frequency divider circuit 61, since the D-FF 62 is added, the power consumption becomes larger compared with the frequency divider circuit 41 shown in FIG. 6.

Third Embodiment

Figure 12:
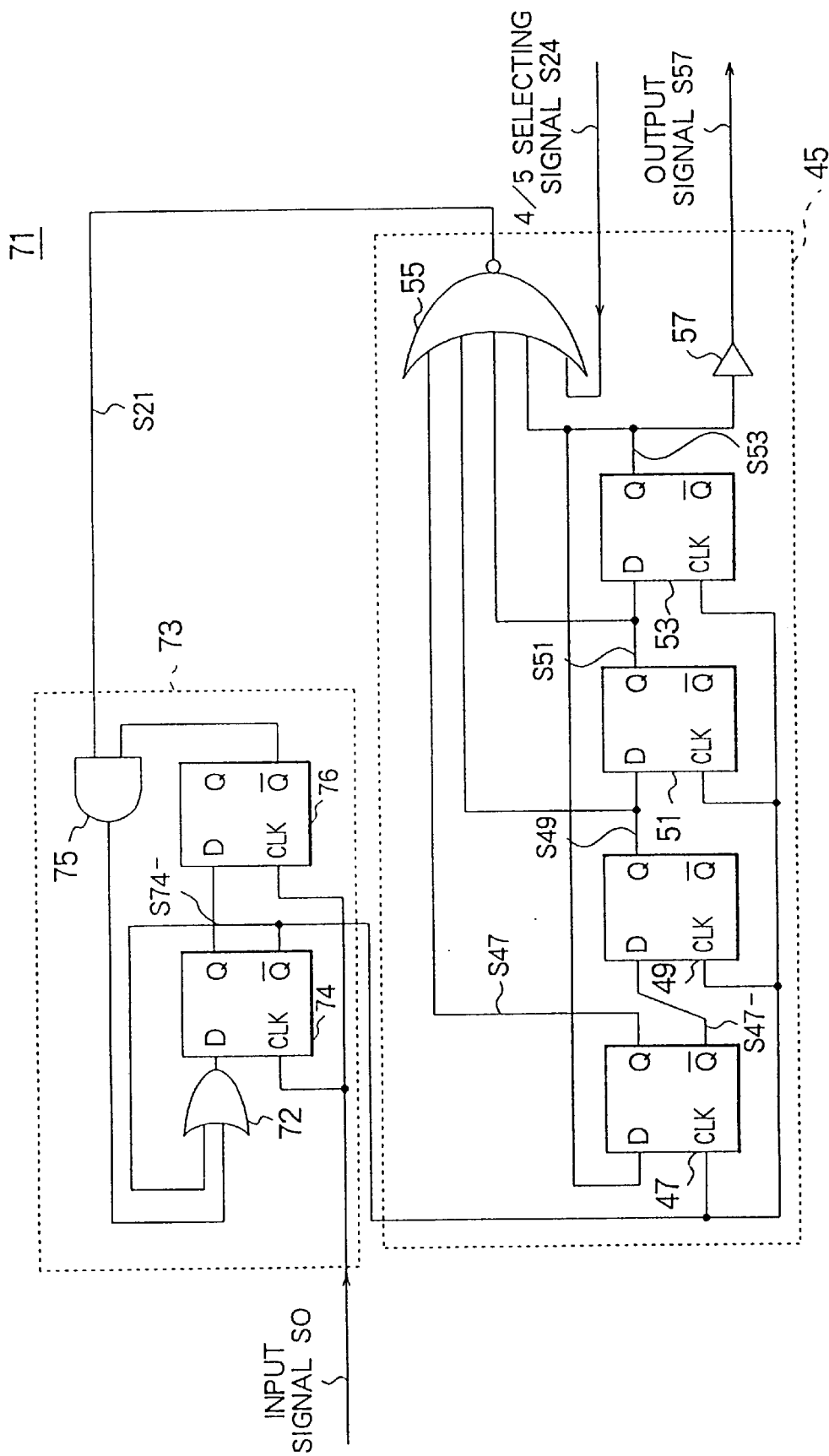
FIG. 12 is a circuit diagram of a frequency divider circuit of a digital PLL circuit according to a third embodiment of the present invention.

FIG. 12 is a circuit diagram of a frequency divider circuit 71 of a digital PLL circuit according to a third embodiment of the present invention.

As shown in FIG. 12, the frequency divider circuit 71 comprises a circuit module 73 serving as a first frequency divider and a circuit module 45 serving as a second frequency divider.

Here, the circuit module 45 is the same as the circuit module 45 of the frequency divider circuit 41 shown in FIG. 6.

The circuit module 73 will be explained in detail below.

The circuit module 73 comprises D-FFs 74 and 76, an AND circuit 75, and an OR circuit 72.

The D-FFs 74 and 76 are driven using the input signal S0 as a reference clock.

A Q terminal of the D-FF 74 is connected to a D terminal OF the D-FF 76. A $\overline{Q}$ terminal of the D-FF 74 is connected to one input terminal of the OR circuit and to CLK terminals of the D-FFs 47, 49, 51, and 53 of the circuit module 45.

The circuit module 73 divides the input signal S0 by 2 or 3 based on the frequency division ratio determining signal S21 shown in FIGS. 7J and 8J and outputs the divided signal $\overline{S74}$ to the circuit module 45 from the $\overline{Q}$ terminal of the D-FF 74. Specifically, when the frequency division ratio determining signal S21 is a high level, the circuit module 73 produces the signal $\overline{S74}$ obtained by dividing the input signal S0 by 3 and the circuit module 45 produces the output signal S57 obtained by dividing the input signal S0 by 17.

Also, when the frequency division ratio determining signal S21 is a low level, the circuit module 73 produces the signal S74 obtained by dividing the input signal S0 by 2 and the circuit module 45 produces the output signal S57 obtained by dividing the input signal S0 by 16.

Fourth Embodiment

Figure 13:
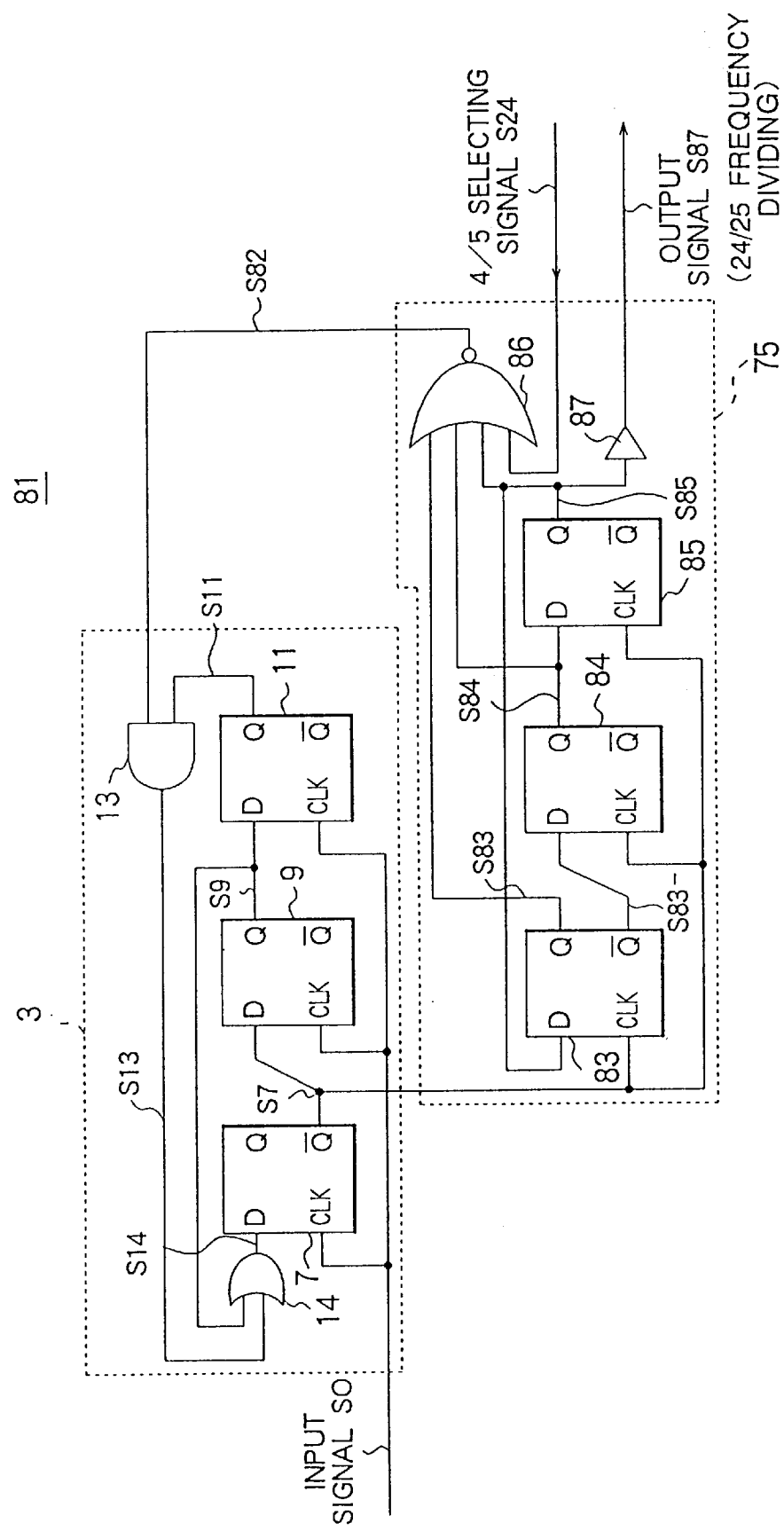
FIG. 13 is a circuit diagram of a frequency divider circuit of a digital PLL circuit according to a fourth embodiment of the present invention.

FIG. 13 is a circuit diagram of a frequency divider circuit 81 of a digital PLL circuit according to a fourth embodiment of the present invention.

The frequency divider circuit 81 selects a frequency division ratio of 24 or 25 to divide the input signal S0.

As shown in FIG. 13, the frequency divider circuit 81 comprises a circuit module 3 serving as a first frequency divider and a circuit module 75 serving as a second frequency divider.

Here, the circuit module 3 is the same as the circuit module 3 of the frequency divider circuit 41 shown in FIG. 6.

Namely, the circuit module 3 produces the signal S7 obtained by dividing the input signal S0 by 4 or 5 based on the frequency division ratio determining signal S82.

Below, the circuit module 75 will be explained.

The circuit module 75 comprises D-FFs 83, 84, and 86, a 4-input NOR circuit 86, and a buffer 87.

A $\overline{Q}$ terminal of the D-FF 83 is connected to a D terminal of the D-FF 84, a Q terminal of the D-FF 84 is connected to a D terminal of the D-FF 85, and a Q terminal of the D-FF 85 is connected to a D terminal of the D-FF 83.

Namely, in this configuration, an output of the $\overline{Q}$ terminal of the D-FF 83 is successively transferred to the D-FFs 84 and 85 and the output of the D-FF 85 is fed back to the D-FF 83.

Also, CLK terminals of the D-FFs 83, 84, and 85 are connected to the $\overline{Q}$ terminal of the D-FF 7 of the circuit module 3 and driven synchronously with the signal S7.

Here, for example, the effect of the level change of the Q terminal of the D-FF 83 is fed back to the Q terminal of the D-FF 83 as an inverted level change after the elapse of a time of a cycle of the signal S7×3 (number of D-FFs 84, 85, and 86). Accordingly, the signals $\overline{S83}$, S84, and S85 become the signal S7 divided by 6.

The NOR circuit 86 receives as input signals S83, S84, and S85 from the Q terminals of the D-FFs 83, 84, and 85 and a 4/5 selecting signal S24 and outputs the result of the NOR operation as a frequency division ratio determining signal S82 to the circuit module 3.

In the frequency divider circuit 81, the circuit module 3 divides the input signal S0 by 4 or 5 based on the frequency division ratio determining signal S82 input from the circuit module 75 and outputs the divided signal S7 to the circuit module 75 from the Q terminal of the D-FF 7. Specifically, when the frequency division ratio determining signal S82 is a high level, the circuit module 3 produces the signal S7 obtained by dividing the input signal S0 by 5 and the circuit module 75 produces the signal S87 obtained by dividing the input signal S0 by 25.

Further, when the frequency division ratio determining signal S82 is a low level, the circuit module 3 produces the signal S7 obtained by dividing the input signal S0 by 4 and the circuit module 75 produces the signal S87 obtained by dividing the input signal S0 by 24.

As explained above, according to the frequency divider circuit 81, it is possible to select the frequency division ratio of 24 or 25 to divide the input signal S0.

Also, in the frequency divider circuit 81, since the circuit module 75 drives the D-FFs 83, 84, and 85 synchronously using the signal S7 as a reference clock, jitter occurring in a preceding stage D-FF is not transferred to the succeeding stage D-FFs and the jitter of the output signal S57 can be largely reduced.

Fifth Embodiment

Figure 14:
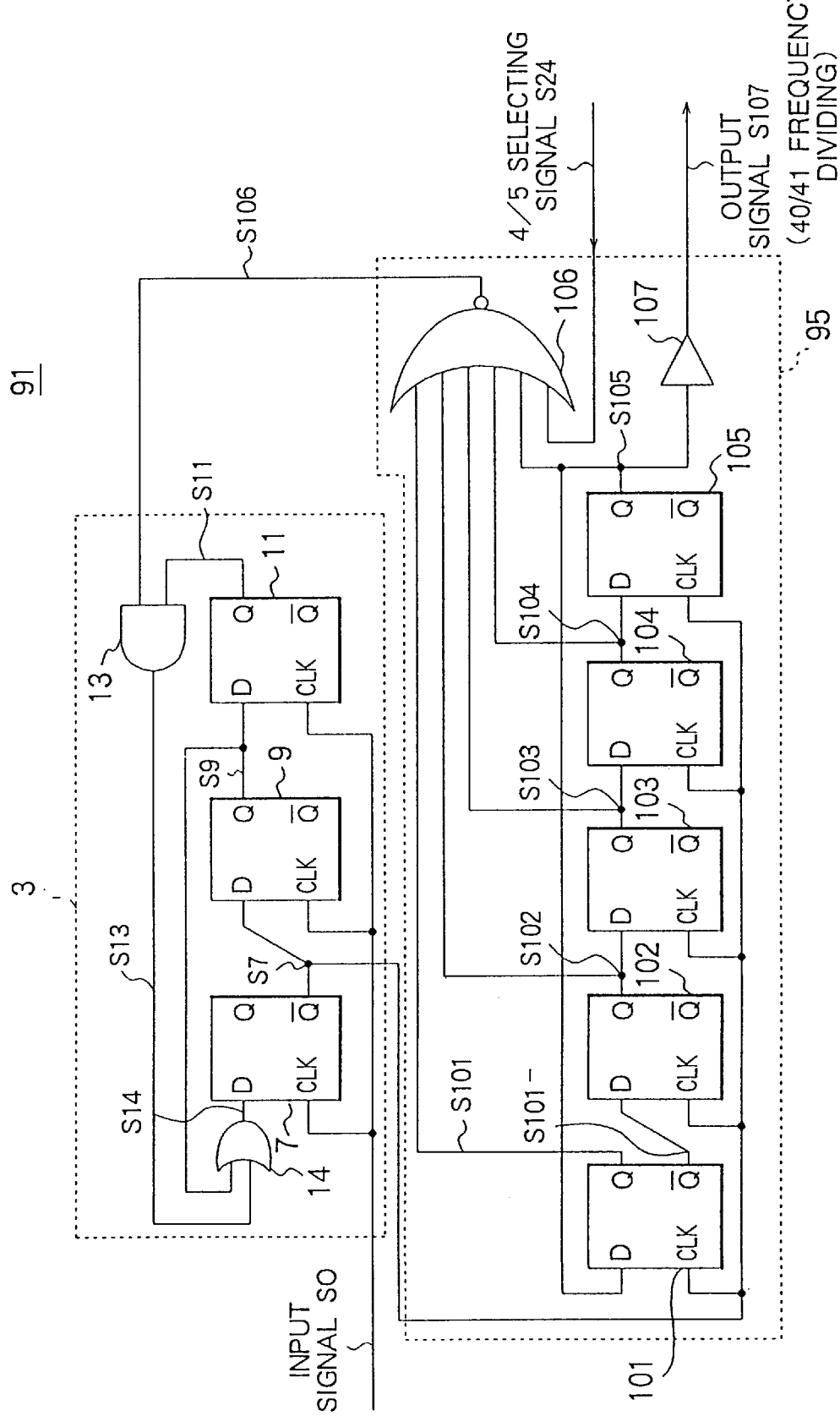
FIG. 14 is a circuit diagram of a frequency divider circuit of a digital PLL circuit according to a fifth embodiment of the present invention.

FIG. 14 is a circuit diagram of a frequency divider circuit 91 of a digital PLL circuit according to a fifth embodiment of the present invention.

The frequency divider circuit 91 selects the frequency division ratio of 40 or 41 to divide the input signal S0.

As shown in FIG. 14, the frequency divider circuit 91 comprises a circuit module 3 as a first frequency divider and a circuit module 95 as a second frequency divider.

Here, the circuit module 3 is the same as the circuit module 3 of the frequency divider circuit 41 shown in FIG. 6.

Namely, the circuit module 3 produces the signal S7 obtained by dividing the input signal S0 by 4 or 5 based on the frequency division ratio determining signal S106.

Below, the circuit module 95 will be explained.

The circuit module 95 comprises D-FFs 101, 102, 103, 104, and 106, a 6-input NOR circuit 106, and a buffer 107.

A Q⁻ terminal of the D-FF 101 is connected to the D terminal of the D-FF 102, a Q terminal of the D-FF 103 is connected to a D terminal of the D-FF 103, a Q terminal of the D-FF 103 is connected to a D terminal of the D-FF 104, a Q terminal of the D-FF 104 is connected to a D terminal of the D-FF 105, and a Q terminal of the D-FF 105 is connected to a D terminal of the D-FF 101.

Namely, in this configuration, the output of the Q⁻ terminal of the D-FF is successively transferred to the D-FFs 102, 103, 104, and 105 and the output of the D-FF 105 is fed back to the input of the D-FF 101.

CLK terminals of the D-FFs 101, 102, 103, 104, and 105 are connected to the Q⁻ terminal of the D-FF 7 of the circuit module 3 and are driven synchronously with the signal S7.

Here, for example, the effect of the level change of the Q⁻ terminal of the D-FF 101 is fed back to the Q⁻ terminal of the D-FF 101 as an inverted level change after the elapse of a time of a cycle of the signal S7×5 (number of D-FFs 101 to 105). Accordingly, the signals S101, S101⁻, S102, S103, S104, and S105 become the input signal S7 divided by 10.

The NOR circuit 106 receives as input the signals S101, S102, S103, S104, and S105 and a 4/5 selecting signal S24 from the Q terminals of the D-FFs 101, 102, 103, 104, and 105 and outputs the result of the NOR operation on the signals to the circuit module 3 as a frequency division ratio determining signal S106.

In the frequency divider circuit 91, based on the frequency division ratio determining signal S106 input from the circuit module 95, the circuit module 3 divides the input signal S0 by 4 or 5 and outputs the divided signal S7 from the Q⁻ terminal of the D-FF 7 to the circuit module 95. Specifically, when the frequency division ratio determining signal S106 is a high level, the circuit module 3 produces the signal S7 obtained by dividing the input signal S0 by 5 and the circuit module 95 produces an output signal S107 obtained by dividing the input signal S0 by 41 using the signal S7 as a reference clock.

When the frequency division ratio determining signal S106 is a low level, the circuit module 3 produces the signal S7 obtained by dividing the input signal S0 by 4 and the circuit module 95 produces an output signal S107 obtained by dividing the input signal S0 by 40 using the signal S7 as a reference clock.

As explained above, according to the frequency divider circuit 91, it is possible to select the frequency division ratio of 40 or 41 to divide the input signal S0 and possible to drive the D-FFs 101 to 105 in a synchronous mode.

Sixth Embodiment

Figure 15:
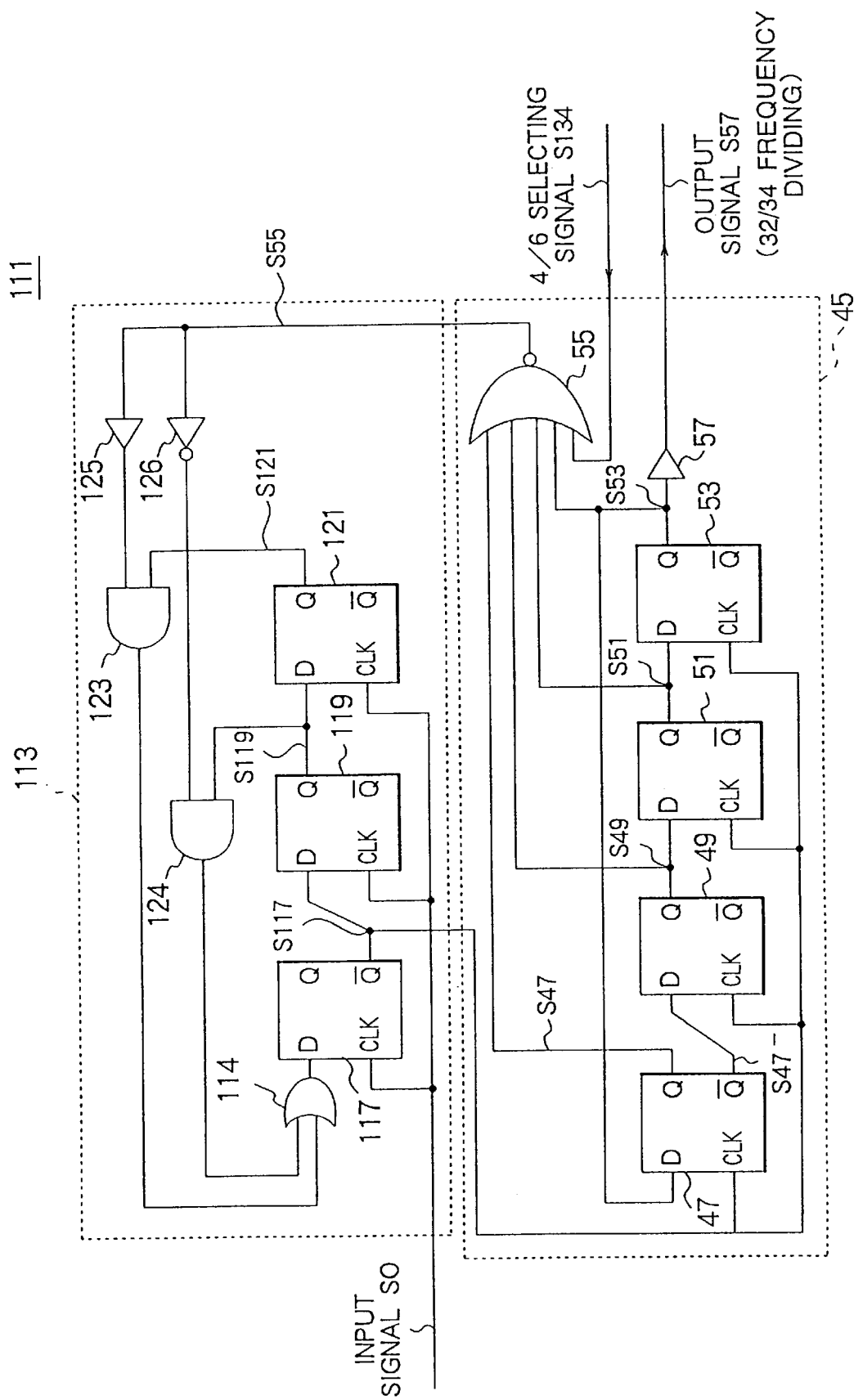
FIG. 15 is a circuit diagram of a frequency divider circuit of a digital PLL circuit according to a sixth embodiment of the present invention.

FIG. 15 is a circuit diagram of a frequency divider circuit 111 of a digital PLL circuit according to a sixth embodiment of the present invention.

The frequency divider circuit 111 selects the frequency division ratio of 40 or 42 to divide the input 3signal S0.

As shown in FIG. 15, the frequency divider circuit 111 comprises a circuit module 113 as a first frequency divider and a circuit module 45 as a second frequency divider.

Here, the circuit module 45 is the same as the circuit module 45 of the frequency divider circuit 41 of the related art shown in FIG. 6.

Namely, the circuit module 45 generates the output signal S57 obtained by dividing the signal S117 by 8.

Below, the circuit module 113 will be explained.

As shown in FIG. 15, the circuit module 113 comprises D-FFs 117, 119, and 121, AND circuits 123 and 124, an OR circuit 114, a buffer 125, and an inverter 126.

In the circuit module 113, a Q⁻ terminal of the D-FF 117 is connected to a D terminal of the D-FF 119 and a Q terminal of the D-FF 119 is connected to a D terminal of the D-FF 121.

The input signal S0 is input to CLK terminals of the D-FFs 117, 119, and 121.

The input terminal of the buffer 125 is connected to the output terminal of the OR circuit 55 and the output terminal of the buffer 125 is connected to one input terminal of the AND circuit 123.

The other input terminal of the AND circuit 123 is connected to a Q terminal of the D-FF 121.

The input terminal of the inverter 126 is connected to the output terminal of the OR circuit 55 and the output terminal of the inverter 126 is connected to one input terminal of the AND circuit 124.

The other input terminal of the AND circuit 124 is connected to the Q terminal of the D-FF 119.

The output terminals of the AND circuits 123 and 124 are connected to the input terminal of the OR circuit 114 and the output terminal of the OR circuit 114 is connected to the D terminal of the D-FF 117.

In the circuit module 113, when the frequency division ratio determining signal S55 is a low level, the signal S119 from the Q terminal of the D-FF 119 is fed back to the D terminal of the D-FF 117 via the AND circuit 124 and the OR circuit 114. Due to this, the signal S117 becomes the input signal S0 divided by 4.

In the circuit module 113, when the frequency division ratio determining signal S55 is a high level, the signal S121 from the Q terminal of the D-FF 121 is fed back to the D terminal of the D-FF 117 via the AND circuit 123 and the OR circuit 114. Due to this, the signal S117 becomes the input signal S0 divided by 6.

Accordingly, when the 4/6 selecting signal S134 is a low level, if the circuit module 45 divides the signal S117 by 8, the output signal S57 becomes the input signal S0 divided by 32. When the 4/6 selecting signal S134 is a high level, if the circuit module 45 divides the signal S117 by 8, the output signal S57 becomes the input signal S0 divided by 34.

As explained above, according to the frequency divider circuit 111, it is possible to select the frequency division ratio of 32 or 34 to divide the input signal S0 and possible to drive the D-FFs 47, 49, 51, and 53 in a synchronous mode.

Note that the present invention is not limited to the above embodiments and includes modifications within the scope of the claims.

In the frequency divider circuit of the present invention, for example, the number of D-FFs connected in series in the first and the second frequency dividers can be arbitrarily set in accordance with frequency division ratios.

Also, while the above embodiments were explained with reference to an example in which two kinds of frequency division ratios can be selected in the first frequency divider, it is possible to provide a configuration capable of selecting three or more frequency division ratios. In this case, for example, a configuration can be provided using a 2- or more bit signal as a frequency division ratio determining signal and feeding back three or more kinds of signals to a D terminal of a first stage D-FF.

Also, while the above embodiments were explained with reference to a D-FF as an example of a storage circuit, it is also possible to use an RS flip-flop, a JK flip-flop, etc.

Furthermore, while the above embodiments were explained with reference to use of a NOR circuit as a frequency division ratio determining means, other circuits can be used so far as the same function can be realized.

As explained above, according to the frequency divider circuit of the present invention, it is possible to select a frequency division ratio from a plurality of frequency division ratios to divide an input signal.

Also, in the frequency divider circuit of the present invention, a plurality of storage circuits of the second frequency divider circuit can be synchronously driven using the first divided signal as a reference clock. As a result, jitter occurring in a preceding stage storage circuit is not transferred to a succeeding stage storage circuit and the jitter of the output signal of the final stage storage circuit can be largely reduced.

According to the digital PLL circuit of the present invention, the effect of phase noise can be suppressed by providing the above frequency divider circuit in the digital counter, therefore, for example, the bit error rate of a digital communication signal can be improved.

What is claimed is:

1. A frequency divider circuit comprising:
   a first frequency divider including a plurality of first storage circuits connected in series and formed as a frequency divider being driven in response to an input signal as a first reference clock signal and dividing said input signal by a frequency division ratio selected by a frequency division ratio determining signal to produce a first divided signal;
   a second frequency divider including a plurality of second storage circuits connected in series and formed as a frequency divider,
   said second frequency divider being driven in response to said first divided signal as a second reference clock signal, each of said plurality of second storage circuits being supplied with the second reference clock signal, and dividing said first divided signal by a frequency division ratio corresponding to the number of said second storage circuits connected in series to produce a second divided signal; and
   a frequency division ratio determining means for producing said frequency division ratio determining signal on the basis of outputs of said second storage circuits of said second frequency divider.

2. A frequency divider circuit as set forth in claim 1, wherein:
   said first frequency divider connects said plurality of first storage circuits to feed back a signal corresponding to a logical AND of an output of a final stage first storage circuit and an output of a circuit other than the final stage first storage circuit to an input of a first stage first storage circuit and uses the inverted output of said first stage first storage circuit as said first divided signal; and
   said second frequency divider connects said plurality of second storage circuits driven based on the first divided signal to receive an inverted output of the first stage first storage circuit to a first stage second storage circuit, and input the output of a final stage second storage circuit to the first stage second storage circuit and uses the output of said final stage second storage circuit as said second divided signal.

3. A frequency divider circuit as set forth in claim 1, wherein:
   said first frequency divider connects said plurality of first storage circuits to feed back an output of a final stage first storage circuit to an input of a first stage first storage circuit and uses the inverted output of said first stage first storage circuit as said first divided signal; and
   said second frequency divider connects said plurality of second storage circuits driven based on the first divided signal to receive an inverted output of a first stage first storage circuit to a first stage second storage circuit, and input the output of a final stage second storage circuit to the first stage second storage circuit and uses the output of said final stage second storage circuit as said second divided signal.

4. A frequency divider circuit as set forth in claim 3, wherein said first frequency divider further connects said plurality of first storage circuits to feed back an output of a prior stage storage circuit before the final stage first storage circuit to the input of said first stage first storage circuit.

5. A frequency divider circuit as set forth in claim 2, wherein said second frequency divider further comprises after the final stage second storage circuit a post-final stage second storage circuit driven by said input signal as a reference clock signal and receiving as input said second divided signal.

6. A frequency divider circuit as set forth in claim 2, wherein said frequency division ratio determining means produces a frequency division determining signal which indicates performance of frequency division by a first frequency division ratio when all of the outputs of all of the second storage circuits in said second frequency divider circuit and the frequency division ratio selecting signal have become a first logical level.

7. A frequency divider circuit as set forth in claim 1, further comprising a swallow counter which produces said frequency division ratio determining signal and performs a count based on the second divided signal produced by said second frequency divider circuit.

8. A frequency divider circuit as set forth in claim 1, wherein said plurality of first and second storage circuits are D-type flip-flops.

9. A digital PLL circuit comprising:
   a frequency divider for producing an oscillation output obtained by dividing an output signal from a frequency multiplying means;
   a phase comparing means for comparing phases of a reference signal and said oscillation output of the frequency divider;
   a digital counter for performing a count using a frequency divider circuit based on the result of comparison of said phase comparing means; and
   a frequency multiplying means for determining an oscillation frequency to produce an output signal based on the result of the count of the digital counter and finally producing an output signal of a target frequency;
   the frequency divider circuit of the digital counter comprising:

a first frequency divider driving a plurality of first storage circuits connected in series using an input signal as a first reference clock signal and dividing said input signal by a frequency division ratio selected by a frequency division ratio determining signal to produce a first divided signal;

a second frequency divider including a plurality of second storage circuits connected in series and formed as a frequency divider, said second frequency divider being driven using said first divided signal as a second reference clock signal, each of said plurality of second storage circuits supplied with the second reference clock signal, and dividing said first divided signal by a frequency division ratio corresponding to the number of said second storage circuits connected in series to produce a second divided signal; and a frequency division ratio determining means for producing said frequency division ratio determining signal on the basis of outputs of said second storage circuits of said second frequency divider.

10. A digital PLL circuit as set forth in claim 9, wherein:

said first frequency divider connects said plurality of first storage circuits to feed back a signal corresponding to a logical AND of an output of a final stage first storage circuit and an output of a circuit other than the final stage first storage circuit to an input of a first stage first storage circuit and uses the inverted output of said first stage first storage circuit as said first divided signal; and said second frequency divider connects said plurality of second storage circuits driven based on the first divided signal so as to receive an inverted output of the first stage first storage circuit to a first stage second storage circuit, and input the output of a final stage second storage circuit to the first stage second storage circuit and uses the output of said final stage second storage circuit as said second divided signal.

11. A digital PLL circuit as set forth in claim 9, wherein:

said first frequency divider connects said plurality of first storage circuits to feed back an output of a final stage first storage circuit to an input of a first stage first storage circuit and uses the inverted output of said first stage first storage circuit as said first divided signal; and said second frequency divider connects said plurality of second storage circuits driven based on the first divided signal to receive an inverted output of a first stage storage circuit to a first stage second storage circuit, and input the output of the final stage second storage circuit to the first stage second storage circuit and uses the output of said final stage second storage circuit as said second divided signal.

12. A digital PLL circuit as set forth in claim 11, wherein said first frequency divider further connects said plurality of first storage circuits to feed back an output of the first storage circuit before the final stage first storage circuit to the input of said first stage first storage circuit.

13. A digital PLL circuit as set forth in claim 10, wherein said second frequency divider further comprises, after the final stage second storage circuit, a post-final stage second storage circuit driven by said input signal as a reference clock signal and receiving as an input said second divided signal.

14. A digital PLL circuit as set forth in claim 10, wherein said frequency division ratio determining means produces a frequency division determining signal which indicates performance of frequency division by a first frequency division ratio when all of the outputs of all of the second storage circuits in said second frequency divider circuit and the frequency division ratio selecting signal have become a first logical level.

15. A digital PLL circuit as set forth in claim 9, wherein said digital counter further comprises a swallow counter which produces said frequency division ratio determining signal and performs a count based on the second divided signal produced by said second frequency divider circuit.

16. A digital PLL circuit as set forth in claim 9, wherein said plurality of first and second storage circuits are D-type flip-flops.

* * * * *